United States Patent [19]

Mitsuoka

[11] 3,986,550

[45] Oct. 19, 1976

[54] HEAT TRANSFERRING APPARATUS

[75] Inventor: Hiroshi Mitsuoka, Amagasaki, Japan

[73] Assignee: Mitsubishi Denki Kabushiki Kaisha, Tokyo, Japan

[22] Filed: July 31, 1974

[21] Appl. No.: 493,407

[30] Foreign Application Priority Data

Oct. 11, 1973 Japan.............................. 48-114108
Nov. 30, 1973 Japan.............................. 48-135024

[52] U.S. Cl............................... 165/105; 174/15 R; 357/82
[51] Int. Cl.²................... F28D 15/00; H01L 23/44
[58] Field of Search...................... 165/105; 357/82; 174/15 HP, 15 R; 317/100

[56] References Cited
UNITED STATES PATENTS

| | | | |
|---|---|---|---|
| 2,529,915 | 11/1950 | Chausson...................... | 165/105 X |
| 3,330,130 | 7/1967 | Schraith et al.................. | 165/105 X |
| 3,543,839 | 12/1970 | Shlosinger...................... | 165/105 X |
| 3,568,762 | 3/1971 | Harbaugh ..................... | 165/105 |
| 3,677,336 | 7/1972 | Moore, Jr. ..................... | 165/105 |

FOREIGN PATENTS OR APPLICATIONS 122,566   5/1958   U.S.S.R............................... 165/105

*Primary Examiner*—Albert W. Davis, Jr.
*Attorney, Agent, or Firm*—Oblon, Fisher, Spivak, McClelland & Maier

[57] ABSTRACT

A heat transferring or transmitting apparatus characterized by an evaporator containing a semiconductive or heat generating device and being disposed below a condensor unit and connected thereto by two conduits substantially vertically arranged therebetween, such that a coolant gas is passed upwardly through one of the conduits and a coolant liquid is passed downwardly through the other of the conduits, features a resistant element, which may be in the form of a liquid reservoir, disposed in the coolant liquid passage so as to prevent flowing of the coolant gas into and through the coolant liquid passage. The paths of the flowing coolant gas and liquid are thereby kept separate whereby frictional contact therebetween is avoided while circulation is maintained through a phase transition process.

7 Claims, 9 Drawing Figures

HEAT TRANSFERRING APPARATUS

BACKGROUND OF THE INVENTION

In general, heat transferring or transmitting apparatus of the character described utilizing phase transition comprises a condensor disposed above an evaporator and connected thereto by a conduit, with a suitable amount of a condensable coolant being sealed in the system of the evaporator, the condensor and the conduit. The coolant in its liquid form is vaporized by the latent heat of gasification in the evaporator and is fed to the condensor by the increasing pressure caused by the gasification and the coolant gas is then condensed by discharging its latent heat, whereupon the condensed coolant liquid flows downward into the evaporator under the force of gravity, and thus the circulation of the coolant is achieved. Accordingly, it is unnecessary to provide a circulation pump, whereby the apparatus can be of simple construction and a large quantity of heat can be effectively transferred or transmitted with a small difference of temperature when the phase transition of a coolant is so utilized.

An important part or element can thus be electrically insulated by using an electrical insulation coolant, whereby the system described is especially suitable for cooling electrical apparatus, and especially, for example, a large capacity semiconductor device which requires high efficiency of heat transfer and the radiation of heat out of the apparatus.

FIG. 1 of the Drawings shows one embodiment of a conventional apparatus which is applied as a heat transferring apparatus utilizing such phase transition of a coolant for cooling a semiconductor device. In this illustration, the reference numeral 1 designates a stack having the structure of a semiconductor or heat generating device equipped with a radiator, which is disposed in an evaporator 2 having a coolant liquid 3 therein so as to cover the stack 1. A condensor 4 is positioned above the evaporator 2 and is connected thereto by a conduit 5 oriented substantially vertically therebetween. Radiation fins 6 are provided about the exterior wall of the condensor 4 for effectively radiating the heat out of the apparatus. Sealed terminals 7 are provided in the evaporator walls for electrically connecting the stack 1 to a suitable power source.

In the conventional apparatus, the coolant 3, which is vaporized by absorbing heat being generated from the stack 1 in the evaporator 2, is fed upward through the conduit 5 to the condensor 4, as shown by the dotted arrow line 8, in a rapid manner by the increasing pressure caused by the gasification in the evaporator and the heat is then discharged by the contacting of the coolant gas with the wall of the condensor, so as to transition the coolant to a liquid phase. On the other hand, the condensed coolant liquid is then returned by flowing down along the inside of the wall of the conduit 5 to the evaporator 2, as shown by the full arrow line 9, where it is used again for cooling the stack 1. The vaporization and the condensation steps are repeated continuously and simultaneously by maintaining the thermal transferring function by phase transition.

However, the natural circulation of the coolant can be smoothly performed only when the quantity of heat is relatively small. Such natural circulation cannot be smoothly performed when the quantity of heat being transferred is substantially increased. This is because the coolant gas and the coolant liquid are counter-currently passed through the conduit 5, as shown by the arrow lines 8 and 9, and accordingly, when the velocity of the coolant gas rising in the conduit 5 increases, depending upon an increase of the heat being transferred, the downward flowing coolant liquid is essentially pushed back thereby toward the condensor side by the friction occurring between the coolant liquid and the coolant gas.

Moreover, the coolant liquid is thus clogged in the conduit 5 so as to disturb the passing of the coolant gas by the coolant liquid, wherein a partial heat-exchange occurs therebetween in the conduit, so as to prevent the proper flow down of the coolant liquid, and at last to defeat completely the function of the heat transferring apparatus. Such trouble is easily caused, depending upon a longer conduit or a curve, a step or a dead end in the conduit, whereby the efficiency of heat transfer becomes unstable and enough heat transfer function cannot be imparted when a large quantity of heat is to be transferred. Thus, in the conventional apparatus, in order to overcome the trouble, the condensor is brought as close to the evaporator as possible, and they are connected by a linear and thick conduit. However, the application or construction is thus limited, disadvantageously.

As stated above, the heat transferring apparatus utilizing natural circulation and phase transition of a coolant has various advantages, however, such troubles as discussed have caused the prevention of the practicl application thereof.

SUMMARY OF THE INVENTION

Accordingly, it is an object of the present invention to provide an improved heat transferring apparatus of the character described having stable efficiency of heat transfer and imparting enough heat transfer function even when a large quantity of heat is transferred, while avoiding the disadvantages of conventional heretofore known apparatus.

The foregoing and other objects as well are achieved according to the present invention by an apparatus characterized by a condensor unit being disposed above an evaporator containing a condensable coolant and an electrical device which is heat-exchangeable to the coolant for vaporizing the same, wherein the evaporator and condensor are connected by a conduit for permitting flow-down of the coolant condensed in the condensor to the evaporator. A separate conduit, which may be in the form of a tube arranged within the conduit, provides a path for the upward flow of coolant gas evaporated in the evaporator to the condensor. In order to prevent frictional contact and flow of the coolant gas through the coolant liquid conduit path, a resistant element is disposed in the liquid coolant path which is permeable to the liquid coolant. Additionally, a flared skirt is provided at the bottom of the tube to further aid in preventing coolant gas from entering the surrounding conduit area designed as a path for coolant liquid being returned to the evaporator.

BRIEF DESCRIPTION OF THE DRAWINGS

Various other objects, features and attendant advantages of the present invention will be more fully appreciated as the same becomes better understood from the following detailed description when considered in conjunction with the accompanying drawings, wherein like reference characters designate like or corresponding parts throughout the several views, and in which.

DESCRIPTION OF THE PREFERRED EMBODIMENTS

Figure 1:
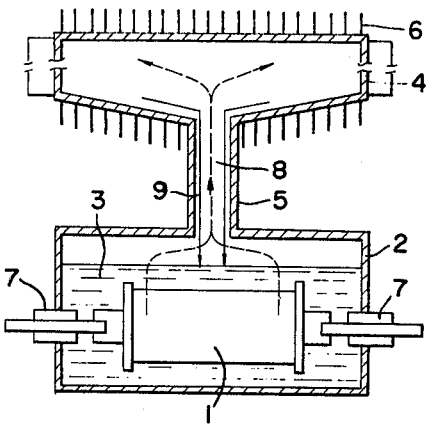
FIG. 1 is a sectional view of conventional apparatus, already described.
Figure 2:
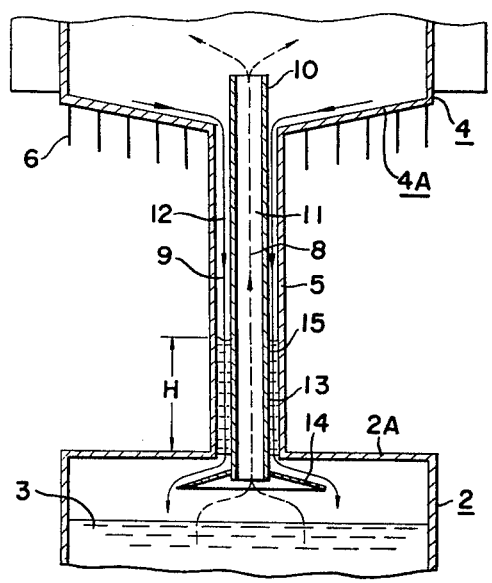
FIG. 2 is a sectional view of the conduit part connecting the evaporator and the condensor according to one embodiment of the present invention.

Referring now to the drawings and more particularly to FIG. 2, an evaporator 2 partially filled with a coolant 3 is shown connected to a condensor 4 disposed thereabove by a conduit 5 extending vertically therebetween. Inside the conduit 5, a partition tube 10 is concentrically disposed, so as to form a coolant gas path 11 therein and a separate coolant liquid path 12 in the region of the conduit 5 surrounding the partition tube 10. The upper end of the partition tube 10 is projected over the bottom 4A of the condensor 4, which is slanted, or taper-shaped, to cause flow of condensed coolant toward its center, and the lower end of the partition tube 10 is lower than the upper wall 2A of the evaporator 2, being disposed above the surface of the coolant liquid. A resistant element 13 is disposed in the coolant liquid path 12 as a resistance for passing the coolant 3, being made of a material to which the coolant liquid is permeable, such as glass fiber, sponge, or the like. A skirt 14 is fixed around the inlet of the coolant gas path 11, or of the partition tube 10, and flares outwardly beyond the outlet of the coolant liquid path, or of the opening of the conduit 5, such as to insure flowing of the coolant liquid outside the upward coolant gas flow, whereby blowing up part of the coolant liquid 3 being returned from the condensor 4 to the evaporator 2 by the coolant gas flow is prevented.

In the embodiment of the invention having the structure described, the coolant gas 3 vaporized in the evaporator 2 flows through the coolant gas path 11 to the condensor 4, wherein it is condensed. When the coolant liquid so condensed begins to flow down through the coolant liquid path 12, the resistant element 13 absorbes the coolant liquid to prevent the flow therethrough of the coolant gas, and the coolant gas therefore rises only through the coolant gas path 11, wherein lower resistance to its flow is present.

On the other hand, the coolant liquid flows down from the condensor 4 through the coolant liquid path 12, as shown by the full arrow line 9, and passes through the resistant element 13 to the evaporator 2. The heat transfer by phase transition and the circulation of the coolant is thus effectively performed between the evaporator 2 and the condensor 4 without adverse effect to the path of the coolant liquid. When a quantity of heat transfer increases, the flow rate of the coolant liquid being returned increases, whereby a height H of the coolant liquid formed in the coolant liquid path 12 is extended to increase the force for returning the coolant liquid by the pressure of the coolant liquid column 15 itself. The increase of the force for returning the coolant liquid also increases the resistance to the upward flow of coolant gas at the resistant element 13.

Figure 3:
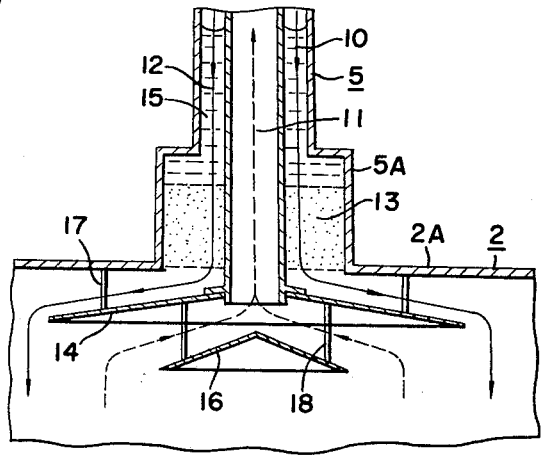
FIGS. 3–9 are respectively partial sectional views of other embodiments of the connecting part according to the present invention.

In FIG. 3, another embodiment of the present invention is shown, wherein a part having larger diameter 5A is formed at the bottom of the conduit 5 and the resistant element 13 having larger sectional area corresponding to the greater size of the conduit bottom is disposed in the part 5A. A baffle 16 for preventing splashing of the coolant liquid around the inlet of the coolant gas path 11 is secured to the lower end of the skirt 14. The skirt 14 is secured to the evaporator top by suspension rods 17 and the baffle 16 is secured to the skirt 14 by similar rods 18. In accordance with this structure, the flow rate of the cooling liquid is not as limited by the resistant element 13, whereby the efficiency of flow of the coolant liquid in the coolant liquid path 12 can be increased, as desired.

Figure 4:
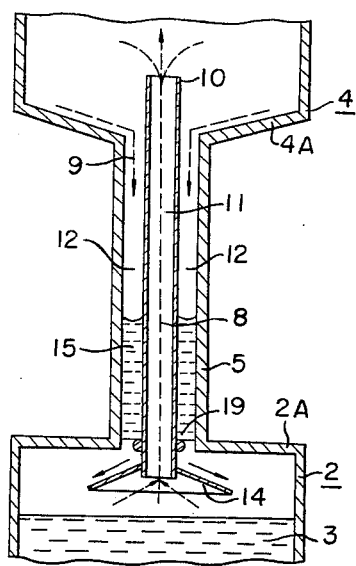

In the embodiment illustrated in FIG. 4, an annular projection 19 is formed on the exterior of partition tube 10 adjacent the region of the evaporator top, and above the skirt 14, whereby the cross-sectional area of the coolant liquid path 12 is locally decreased, so as to provide the effect of the resistant element 13 of the previously described embodiments. The projection 19 can be easily formed by welding a ring or the like on the partition tube 10.

While the projection 19 is shown being disposed on the partition tube 10 in FIG. 4, if desired, it is possible instead to dispose such a projection on the inner wall of the conduit 5 or on both of the partition tube 10 and the conduit 5. In this embodiment, the coolant gas path and the coolant liquid path are thus formed by inserting the partition tube 10 in the conduit 5.

Figure 5:
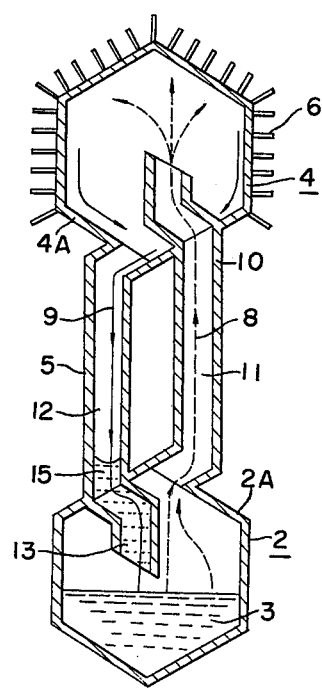
Figure 7:
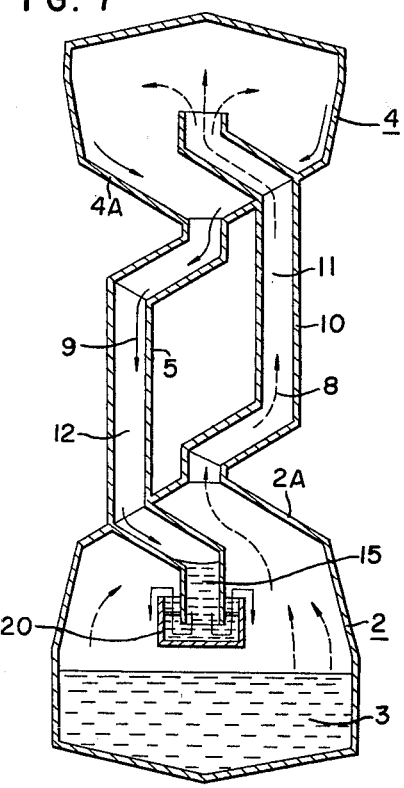
Figures 8, 9:
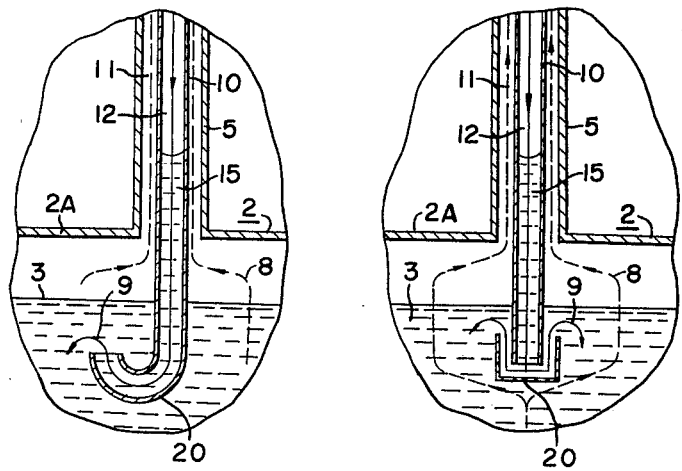

However, it is not always necessary to form the two paths in one conduit, but rather it is possible to form the coolant gas path 11 and the coolant liquid path 12 separately by disposing two conduits 5 and 10, if desirable, as shown in FIG. 5, wherein conduit 5 extends from the lowermost portion of the condensor 4 and projects into the evaporator 2 disposed therebeneath and conduit 10 is disposed substantially in parallel relation therewith and outside the conduit 5, extending from the top of evaporator 2 and projecting into the condensor 4.

As illustrated in this embodiment, the coolant gas vaporized from the evaporator 2 and the coolant liquid condensed in the condenser 4 are separately passed through different paths and the resistant element 13 for resisting the flow of the coolant liquid is disposed in the coolant liquid path, whereby undesirable friction between the coolant gas and the coolant liquid is prevented and the efficiency of heat transfer becomes stable and a satisfactory heat transfer function can be imparted, even when a large quantity of heat transfer is required.

Referring now to FIGS. 6 – 9, other embodiments of the invention using a liquid reservoir 20, instead of the resistant element 13, are illustrated.

Figure 6:
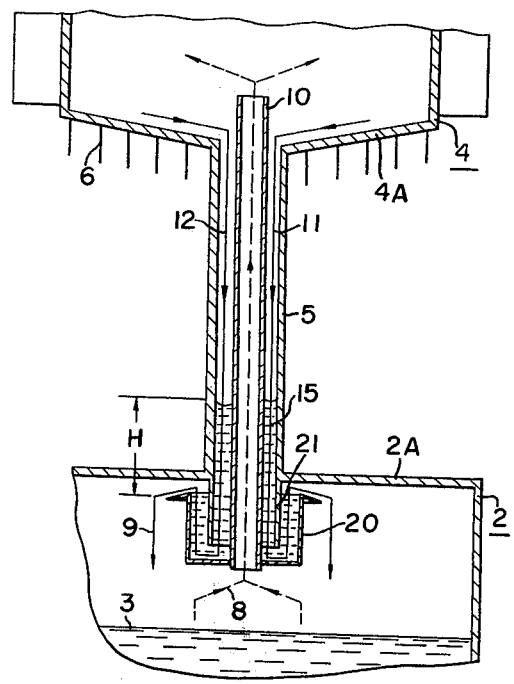

In FIG. 6, the liquid reservoir 20 is a cap type configuration and is disposed on the lower outer part of the partition tube 10, with the open end being faced upwardly and the lower edge of the partition tube 10 being passed through the center of the liquid reservoir 20. A tube 21 forming a projection of conduit 5 extends downward from the upper wall 2A of the evaporator 2 being aligned with the conduit 5, and the lower end of the tube 21 is inserted into the liquid reservoir 20, with the bottom edge thereof being slightly spaced from the bottom of the cap-shaped reservoir 20. Thus, the coolant gas 3 vaporized in the evaporator 2 is passed through the coolant gas path 11 to the condensor 4, as shown by the dotted arrow line 8, wherein condensation takes place. The coolant liquid 3 condensed in the condensor 4 is then passed through the coolant liquid path 12 to the liquid reservoir 20 to gradually form a liquid column 15. When the quantity of the coolant liquid returned to the evaporator 2 increases, depending upon the increase of the quantity of the heat transfer, the height H of the liquid column 15 formed in the coolant liquid path 12 increases so that the coolant liquid 3 reserved in the liquid reservoir 20 is overflown by the pressure of the liquid column 15 and the coolant liquid 3 is thus returned to the evaporator 2. Accordingly, the coolant gas 3 vaporized in the evaporator 2 is not passed through the coolant liquid path 12 to the condensor 4 as the coolant liquid 3 is in the liquid reservoir 20 and blocks such flow.

Accordingly, the counter current flow of the coolant gas with the flow of the coolant liquid 3, whereby undesirable friction occurs between the coolant liquid and the coolant gas, is not present. Also, even though the pressure of the evaporator 2 increases, circulation of the coolant gas and liquid can be smoothly performed, as the liquid column 15 corresponding to the pressure is formed.

Incidentally, in the embodiment shown in FIG. 6, the coolant gas path 11 and the coolant liquid path 12 are formed by inserting the partition tube 10 in the conduit 5, as in previously described embodiments. However, it is not always necessary to form these paths in one conduit 5, but rather, if desired, it is possible to dispose the two conduits 5 and 10 separate from one another so as to form the coolant gas path 11 and the coolant liquid path 12 in separate spaced conduits, as shown, for example, in FIG. 7.

It is also possible to dip the lower end of the partition tube 10 in the coolant liquid in the evaporator 2. In this case, as illustrated in the embodiments shown in FIGS. 8 and 9, the inner part of the partition tube 10 becomes the coolant liquid path 12 and the space between the conduits 5 and 10 becomes the coolant gas path 11. Also, the liquid reservoir 20 is in the coolant liquid, and the liquid reservoir 20 can be formed by a U-shaped curve at the end of the partition tube 10, s shown in FIG. 9, without forming a separate device therefor.

Even though the coolant liquid path 12 is dipped in the coolant liquid, it is possible to prevent a bubble floating in the coolant liquid 3, and passing in the coolant liquid path 12, as the end opening of the liquid path 12, or of the conduit 10, is faced upward toward the liquid surface.

Thus, in accordance with the embodiments of FIGS. 6 – 9, the coolant gas from the evaporator 2 and the coolant liquid from the condensor 4 are respectively passed through different paths and a liquid reservoir is disposed in the end opening of the coolant liquid path for preventing the flow therethrough of the coolant gas, whereby the undesirable friction between the coolant gas and the coolant liquid is prevented and the efficiency of heat transfer becomes stable and a satisfactory heat transfer function can be imparted even when a large quantity of heat transfer is required.

Obviously many modifications and variations of the present invention are possible in light of these teachings. It is therefore to be understood that within the scope of the appended claims, the invention may be practiced otherwise than as specifically described herein.

What is claimed as new and desired to be secured by Letters Patent of the United States is:

1. A heat transferring apparatus comprising:
an evaporator containing a condensable coolant and means for vaporizing said condensable coolant;
a condensor disposed above said evaporator;
a conduit, the sectional area of which is less than that of said evaporator and said condensor, connecting between a part of the bottom of said evaporator and a part of the top of said condensor, said bottom of said condensor being sloped slightly downwardly toward the interconnection between said condensor and said evaporator so as to facilitate the flow of condensed coolant liquid to said conduit;
a tube arranged substantially concentrically within said conduit so as to define a substantially annular chamber therebetween and having one end thereof projecting downwardly into said evaporator and the other end projecting into said condensor;
said tube providing a coolant gas path for passing the coolant gas vaporized in said evaporator to said condensor;
said substantially annular chamber formed between said concentrically disposed conduit and tube providing a coolant liquid path for returning the coolant liquid condensed in said condensor back to said evaporator;
a resistant element disposed within said annular chamber and said coolant liquid path for resisting the upward flow of the coolant gas therein in the direction of said condensor, and
flared skirt means secured to the lower end of said tube and within said evaporator for collecting said evaporated coolant gas and conducting the same into said tube to said condensor, and for defining, with said tube, said conduit, and said evaporator, an extension of said annular chamber for conducting said condensed coolant liquid back to said evaporator,
whereby heat transfer is performed by phase transition of the coolant and the circulation thereof because of the different vertical disposition of said condensor and said evaporator.

2. A heat transferring apparatus according to claim 1, wherein said resistant element is formed of a material permeable to said coolant liquid.

3. A heat transferring apparatus according to claim 1, wherein said resistant element comprises a projection formed on the outer peripheral wall of said tube near the bottom end thereof.

4. A heat transferring apparatus according to claim 1, wherein said resistant element comprises a projection formed on the inner periphery of said conduit near the bottom end thereof.

5. A heat transferring apparatus according to claim 1, wherein said conduit at the lower end thereof has a portion of greater diameter than the upper portion thereof and said resistant element is disposed in said portion of greater diameter.

6. A heat transferring apparatus according to claim 1, further comprising a baffle disposed at the lower part of said tube beneath said skirt.

7. A heat transferring apparatus according to claim 1, wherein said coolant gas path and said coolant liquid path are formed by two conduits arranged in parallel relation to each other.

* * * * *